United States Patent
Becker et al.

(10) Patent No.: US 10,154,581 B2
(45) Date of Patent: Dec. 11, 2018

(54) METHOD FOR IMPEDANCE COMPENSATION IN PRINTED CIRCUIT BOARDS

(71) Applicant: Cray Inc., Seattle, WA (US)

(72) Inventors: Andy Becker, Eau Claire, WI (US); Hyunjun Kim, Mercer Island, WA (US); Shawn Utz, Kent, WA (US); Paul Wildes, Eau Claire, WI (US)

(73) Assignee: Cray Inc., Seattle, WA (US)

(*) Notice: Subject to any disclaimer, the term of this patent is extended or adjusted under 35 U.S.C. 154(b) by 152 days.

(21) Appl. No.: 15/428,865

(22) Filed: Feb. 9, 2017

(65) Prior Publication Data

US 2018/0228019 A1 Aug. 9, 2018

(51) Int. Cl.
*G06F 17/50* (2006.01)
*H05K 1/02* (2006.01)
*H05K 1/11* (2006.01)
*H05K 3/40* (2006.01)
*H05K 3/00* (2006.01)
*H05K 3/42* (2006.01)

(52) U.S. Cl.
CPC ....... *H05K 1/0251* (2013.01); *G06F 17/5009* (2013.01); *G06F 17/5072* (2013.01); *G06F 17/5081* (2013.01); *H05K 1/024* (2013.01); *H05K 1/112* (2013.01); *H05K 1/116* (2013.01); *H05K 3/0005* (2013.01); *H05K 3/4007* (2013.01); *H05K 3/4038* (2013.01); *H05K 3/429* (2013.01); *H05K 1/113* (2013.01); *H05K 2201/096* (2013.01); *H05K 2201/09454* (2013.01); *H05K 2201/09718* (2013.01); *H05K 2201/09781* (2013.01)

(58) Field of Classification Search
CPC ......... H05K 3/429; H05K 2201/09236; H05K 1/0245; H05K 1/0298; H05K 1/115; H05K 2201/0949; H05K 1/116; H05K 2201/09454; H05K 2201/09545; H05K 2201/09636; H05K 3/4038; H05K 1/113
USPC .................................. 716/111, 118–120, 137
See application file for complete search history.

(56) References Cited

U.S. PATENT DOCUMENTS

| | | | |
|---|---|---|---|
| 6,137,064 A | 10/2000 | Kiani et al. | |
| 6,208,225 B1 | 3/2001 | Miller | |
| 6,380,608 B1 | 4/2002 | Bentley | |
| 6,538,538 B2 | 3/2003 | Hreish et al. | |
| 6,661,316 B2 | 12/2003 | Hreish et al. | |
| 6,812,803 B2 | 11/2004 | Goergen | |
| 7,448,909 B2 | 11/2008 | Regnier et al. | |
| 7,608,500 B2 | 10/2009 | Anthony et al. | |
| 7,633,766 B2 | 12/2009 | Renier et al. | |
| 8,723,048 B2 | 5/2014 | Wu et al. | |

(Continued)

*Primary Examiner* — Nghia Doan
(74) *Attorney, Agent, or Firm* — Craig J. Lervick; Larkin Hoffman Daly & Lindgren, Ltd.

(57) ABSTRACT

The various structures forming communication paths on a printed circuit board can create several undesired effects, especially when high frequency signals are considered. Non-functional pads created during the manufacturing process have the potential to create an undesired effect, but when the overall collection of non-functional pads are carefully configured, an optimized communication path can be formed. More specifically, by selectively removing some collection of the non-functional pads, the high frequency characteristics of the communication paths can be optimized.

14 Claims, 7 Drawing Sheets

(56) References Cited

U.S. PATENT DOCUMENTS

| | | |
|---|---|---|
| 8,970,327 B2 | 3/2015 | Kushta |
| 2002/0130737 A1 | 9/2002 | Hreish et al. |
| 2003/0080835 A1 | 5/2003 | Hreish et al. |
| 2004/0150970 A1* | 8/2004 | Lee ...................... H05K 1/0251 361/794 |
| 2005/0201065 A1 | 9/2005 | Regnier et al. |
| 2007/0074905 A1* | 4/2007 | Lin .................... G06F 17/5068 174/263 |
| 2012/0112868 A1 | 5/2012 | Wu et al. |

\* cited by examiner

METHOD FOR IMPEDANCE COMPENSATION IN PRINTED CIRCUIT BOARDS

BACKGROUND

Printed circuit boards (PCBs) are specifically designed to support electronic components, and facilitate the communication of electrical signals. As PCBs have evolved, the complexity of the electronic components and the complexity of the signal transmission structures have also evolved considerably. To accommodate the complex circuit design typically involved, modern day circuit boards are multilayer structures, having multiple communication paths extending between hundreds of different components.

In common day PCB design, there has been an increased demand for high-speed communication capabilities. This typically involves the ability to provide a high-speed or high-frequency connection between two or more mounted components, with signals being carried by communication paths extending through the circuit board structure. Further, these communication paths may extend for relatively short distances or may extend longer distances, depending upon the nature of the circuit board and the environment within which the board is used. In addition, a number of these communication paths must traverse several layers in a circuit board, thus adding further complexity to the communication paths. As mentioned above, high-speed signal transmission is also commonly demanded, typically involving signals with a frequency range of 3 to 56 gigabits per second (Gbps), or even higher. Operating at this speed produces several complications, and creates a need to closely examine signal losses throughout the PCB.

As can be appreciated, when high speed signals, operating at a speed of 3 gigabits per second (Gbps) or higher are moving across the PCB, the various effects of most circuit board structures can potentially produce inefficiency, and create undesirable effects. In many cases, this may include signal attenuation or signal losses which are unacceptable. This is especially true when complex high speed circuit board design is involved.

As known by those involved with the design of printed circuit boards, electrical signals are carried between components using various types and lengths of signal traces. Due to the number of components involved, and the multiple signals that must be communicated between these components, current circuit board design uses various layers of the board structure to accommodate this function. The space on the various layers can be used for multiple signal traces, depending upon the space requirements. The various layers are then separated by a dielectric material to contain signals within the desired layer and along the desired signal trace.

When a communication path in a printed circuit board needs to traverse from one board layer to another layer, it travels through a drilled and plated hole called a 'via'. While this provides an efficient communication path, the electrical impedance of this via will often differ significantly from the electrical impedance of the signal trace. This difference in impedance tends to degrade the electrical quality of the entire communication path. In manufacturing the PCB, a small circular pad of metal typically remains on each of the intervening layers and surrounds the hole. This creates a structure that is helpful in the PCB lamination process, but has no functional purpose for the circuit involved (i.e. it creates non-functional pads). Stated differently, this non-functional pad has no electrical function, but helps to facilitate board construction and reliability. In current PCB design practice, the inner non-functional pads are either all left in place, or all removed, without respect to the actual electrical characteristics of the path.

SUMMARY

In order to improve the performance of printed circuit boards, the above-mentioned nonfunctional pads are taken into consideration when finalizing circuit board design. It has been discovered that the presence of these nonfunctional pads creates unintended electrical signal degradation due to the various electrical impedance mismatches. Further, it has also been discovered that simply removing all nonfunctional pads does not create an optimum operating condition.

Based upon the above-mentioned discoveries, circuit boards manufactured utilizing the principles of the present invention will have nonfunctional pads selectively removed to provide optimal operating characteristics. More specifically, the impedance of the communication path, including the plated vias, is first determined when all existing pads are present. Next, through simulation and testing, the impedance is determined when selected nonfunctional pads are removed. In one embodiment, this involves the determination of an impedance profile for all possible variations and configurations. Using this process for each via within a circuit board, the overall impedance, and electrical characteristics for the signal carrying paths of the circuit board as a whole, are characterized and can be optimized. When all vias are collectively optimized in this manner, the overall operating characteristics, and reliability, of the printed circuit board are greatly improved.

BRIEF DESCRIPTION OF THE DRAWINGS

Further objects and advantages of the present method and resultant circuit boards can be seen from reading the following detailed description, in conjunction with the drawings in which.

DETAILED DESCRIPTION

In the various embodiments outlined below, systems and methods are illustrated which help to optimize the functional characteristics of a printed circuit board. More specifically, the methods involved help to optimize the impedance characteristics of the printed circuit board, thus providing for more efficient and reliable operation.

Figure 1:
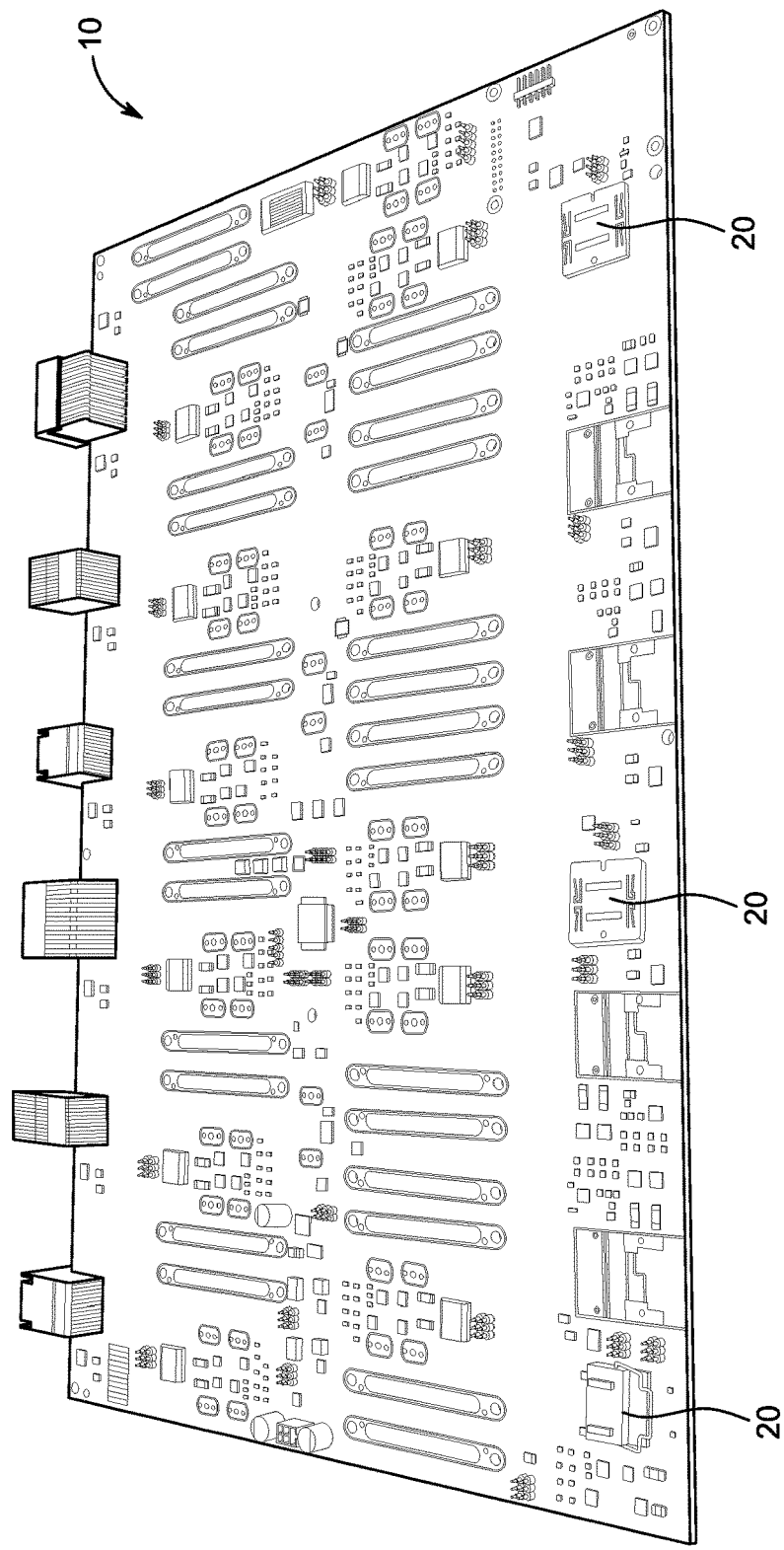
FIG. 1 is a general perspective view of an exemplary printed circuit board.

Generally illustrated in FIG. 1 is one exemplary circuit board 10 which will be easily recognized by those skilled in the art. In this particular example, the various components 20 are attached to an upper surface circuit board 10. Each component 20 has some type of electrical contact which is coupled to an appropriate pad on the circuit board (not shown), thus making the component electrically operable. To further allow connections between components, various signal traces 30 (not shown in FIG. 1.) are formed throughout the circuit board 10. Again, as will be recognized, these signal traces 30 allow for the communication of electrical signals between components 20. As will also be recognized, various other connectors and related components could also be included on circuit board 10, to accommodate connection to other systems.

Figure 2:
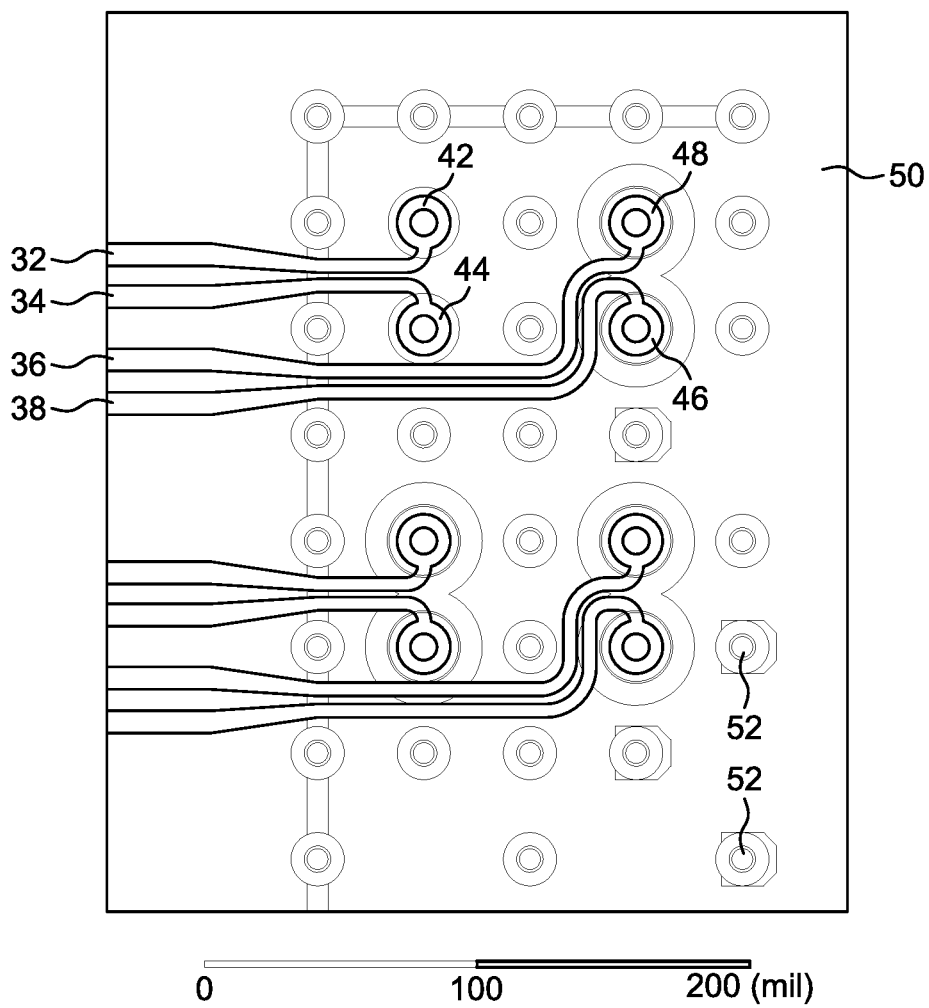
FIG. 2 is a top view of one layer of an exemplary circuit board.

Referring now to FIG. 2, various portions of a second exemplary circuit board 50 is illustrated. In this particular version, one layer is illustrated, having a number of vias 52 illustrated thereon. Again, as recognized, these vias allow electrical signals to be carried from one layer to another. Also shown in FIG. 2 are exemplary signal traces 32, 34, 36, 38. In this particular layer, these signal traces are connected to pads 42, 44, 46 and 48, respectively.

Figure 3:
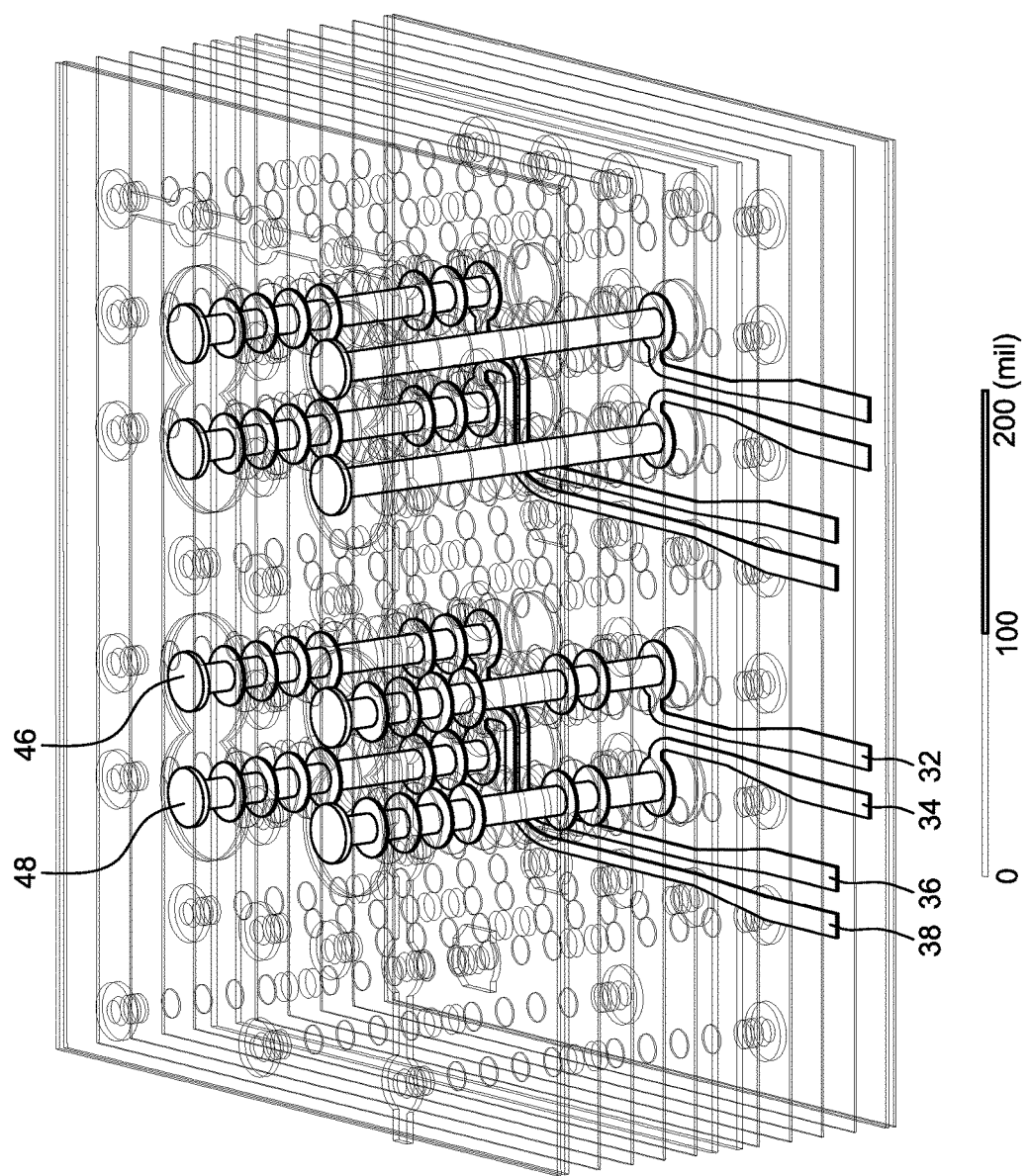
FIG. 3 is a perspective view of an exemplary circuit board having several layers shown in phantom.
Figure 4:
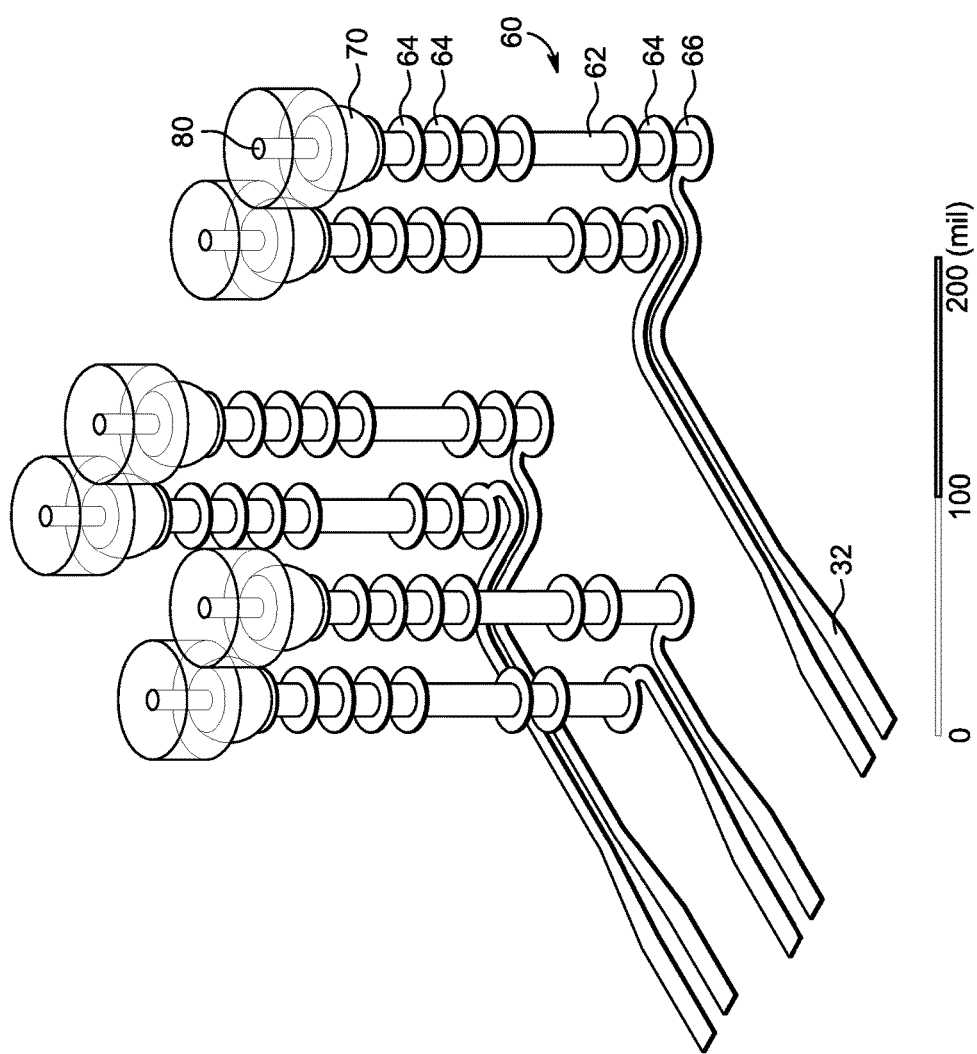
FIG. 4 is a perspective view of several vias illustrated in isolation.

FIG. 3 is an exploded perspective view of circuit board 50, with the various layers shown in phantom, thus allowing for the vias to be seen. In isolation, each via generally takes the form of a post or cylinder. More specifically, however, the vias are formed by coating or copper plating the inner surface of holes in the various layers. As such, this cylindrical structure is formed as the circuit board is fabricated. In a similar matter, FIG. 4 illustrates the via structures alone. In this case, six cylindrical vias are illustrated. Referring to a first via 60, it will be appreciated that the structure includes a central cylindrical portion 62 and a number of non-functional pads 64. On a bottom layer, a functional pad 66 is illustrated, which in this case is connected to a signal trace 32. At an upper end of via 60 is a solder ball 70, and the electrical connecting portion 80 of an electrical component. As will be recognized, this type of solder ball structure is utilized to create electrical connections between the electrical components and the via structure 60. In this particular figure, each of the remaining vias all have identical structures. That said, it will be recognized and understood that these structures may vary, including the height, number of non-functional pads, location of functional pads, etc. As further recognized, the via and all functional and non-functional pads are formed of an electrically conductive material, thus allowing electrical signals to be appropriately communicated.

Figure 5A:
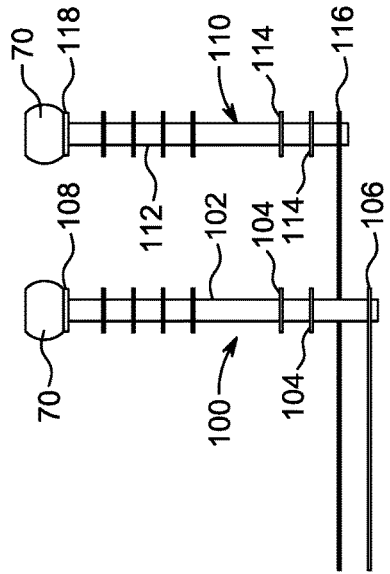
FIGS. 5A through 5C illustrate a cross-sectional view of two vias, in which selected nonfunctional pads have been removed.
Figure 5B:
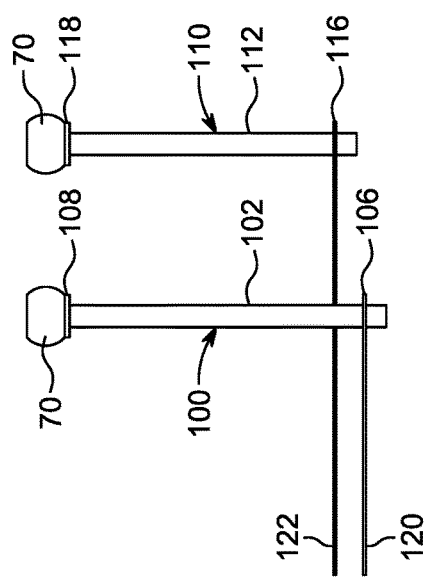
Figure 5C:
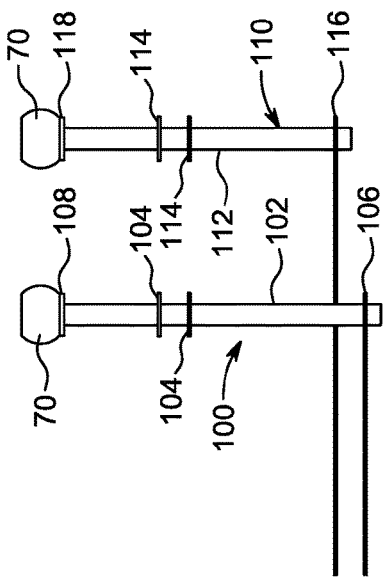

Turning now to FIGS. 5A through 5C, two of the vias have been isolated for further discussion purposes. Here, a first via 100 and a second via 110 are illustrated in a generally cross-sectional format. First via 100 is connected to a signal trace 120, while second via 110 is electrically connected to a second signal trace 122. As shown, these structures are identical in FIGS. 5A, 5B and 5C.

Similar to the structure discussed in relation to FIG. 4 above, first via 100 includes a central cylindrical portion 102, a number of non-functional pads 104, a functional pad 106 (electrically connected to signal trace 120), and a surface electrical pad 108 configured for electrical connection to an electrical component (not shown). In each case, a solder ball 70 is illustrated at an upper portion of the first via 100 and a second via 110. While several of these structures are very similar, it will be appreciated that FIG. 5A does not include any non-functional pads, FIG. 5B includes a plurality of non-functional pads, and FIG. 5C includes only a pair of non-functional pads. The details regarding these structures are discussed below.

As contemplated, all of these via structures 100, 110 are specifically configured to provide electrical connections as part of a printed circuit board. As appreciated, each of these structures, based upon the materials used and the configuration, have electrical impedance characteristics which must be accounted for when carrying out circuit designs. It has been discovered, however, that the existence of non-functional pads can change the electrical impedance characteristics. In some cases, these cases are detrimental and undesired, as they will create signal impairment, multiple unwanted reflections, and loss at various frequencies. To accommodate these anomalies, the method of the present invention specifically considers these impedance variations, and adjusts the printed circuit design as necessary.

Figure 6:
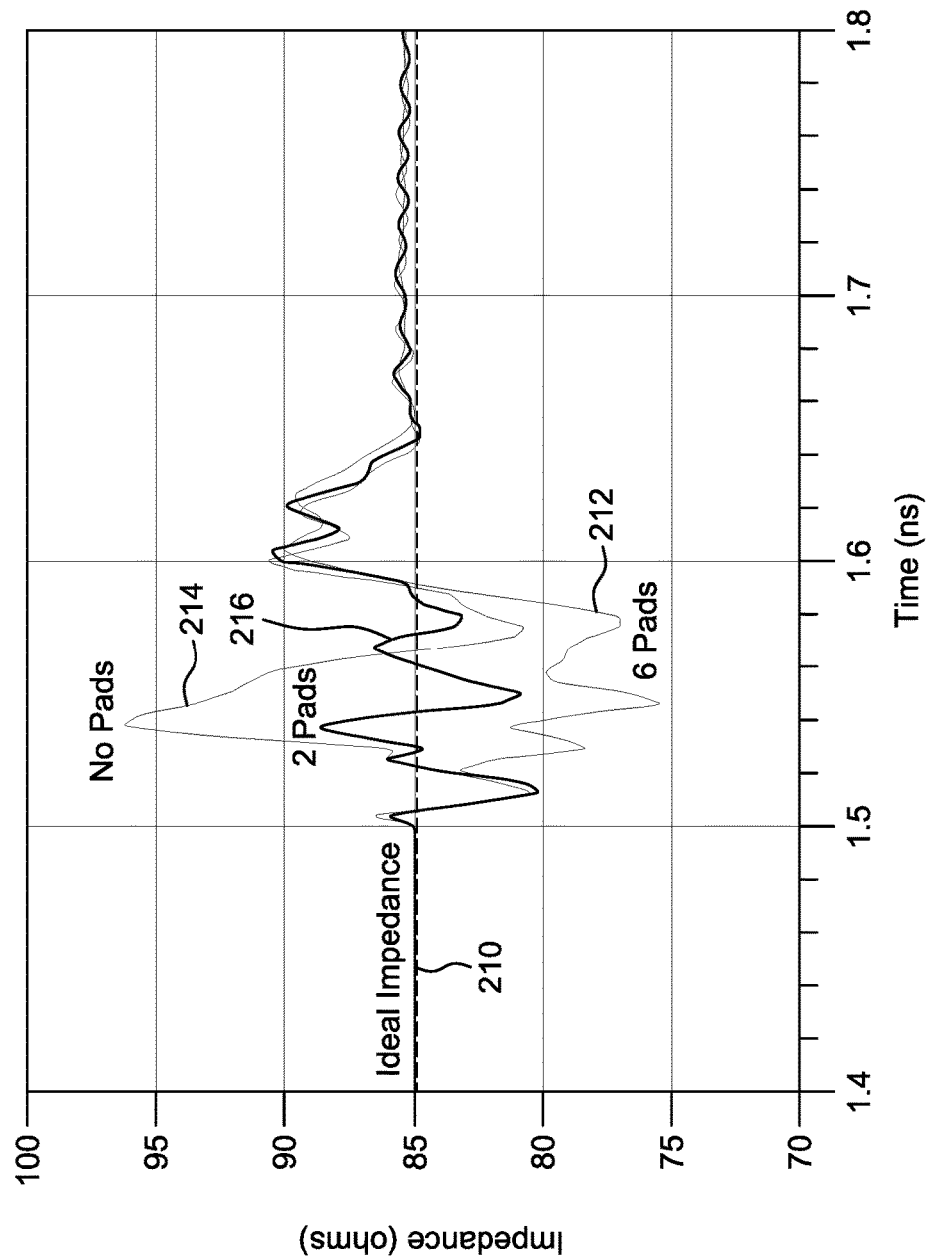
FIG. 6 is a graphical illustration of an impedance profile, illustrating the impedance characteristics for several possible via variations.

Turning now to FIG. 6, with continual reference to FIGS. 5A through 5C, a graphical illustration showing the impedance characteristics is shown. In this graphical illustration, the impedance characteristics for various structures are illustrated. As shown, it would be ideal to have a constant ideal impedance across all frequencies, as shown in line 210. However, when the actual impedance for the via structure is measured, the impedance characteristic for the original structure (having all non-functional vias included) is not constant and varies, as illustrated in line 212. Using further modeling techniques, it is possible to determine that the impedance will vary differently if all non-functional pads are removed. Based upon a particular modeling of this structure, line 214 illustrates the impedance characteristics while all such non-functional pads are removed. In a similar manner, utilizing the methods of the present invention, it was possible to determine that leaving the two non-functional pads illustrated in FIG. 5C results in an impedance characteristic shown by line 216. As will be appreciated, while this is not constant, it illustrates fewer variations in impedance over the entire frequency range. Thus, this provides a much more desirable structure, from an electrical impedance standpoint.

As discussed, above, utilizing simulation and lab measurements to identify the actual electrical impedance of the given plated via, in conjunction with the remainder of the electrical path provides a valuable tool. Armed with this information, the internal non-functional metal pads can be selectively removed, to provide the closest possible impedance match to the rest of the signal trace, thereby improving electrical performance. In this way it is possible to create custom tuning of the via structure, to compensate for the impedance variations in both the via barrel and associated adjacent structures, thereby facilitating reliable high-frequency operation.

During standard printed circuit board processing, the functional and non-functional pads are placed into the via design automatically. In some circumstances, the printed circuit board fabrication drawing will instruct fabricators to remove all of the non-functional pads, in order to improve the signal performance. Presently, the non-functional pads are either all left in place, or all of the non-functional pads are removed, depending on the signal characteristics of the via design. By utilizing the design process of the preferred embodiments, the non-functional pads can be selectively removed to create an optimum design, customizing each via, depending on its signal trace escape layer. As generally set forth in the flowchart of FIG. 7. the process to design and optimize the printed circuit board, and utilize the selective via pad removal proceeds, generally follows these steps: 1.) Identify each layer of the circuit board which includes a signal escape, and which requires custom optimization for high-speed routing. 2.) For each identified layer, create an electrical 3D model of each via and each layer escape trace to be optimized for high-speed performance. 3.) Simulate the electrical performance of each layer escape with all pad removal options and/or variations, to produce electrical performance models for each pad removal configuration. 4.) Based upon the circuit simulation and electrical performance models, determine which pad removal option produces the optimum electrical performance, for the given layer escape under investigation. This will be the pad removal design to be implemented for all vias escaping on this particular signal layer. 5.) Repeat steps 3&4 to produce the optimal designs for the other signal layer escapes requiring high-speed signal optimization. Following this process, all of the critical signal vias can be optimized for performance through this selective pad removal process, and customized for each printed circuit escape layer.

Figure 7:
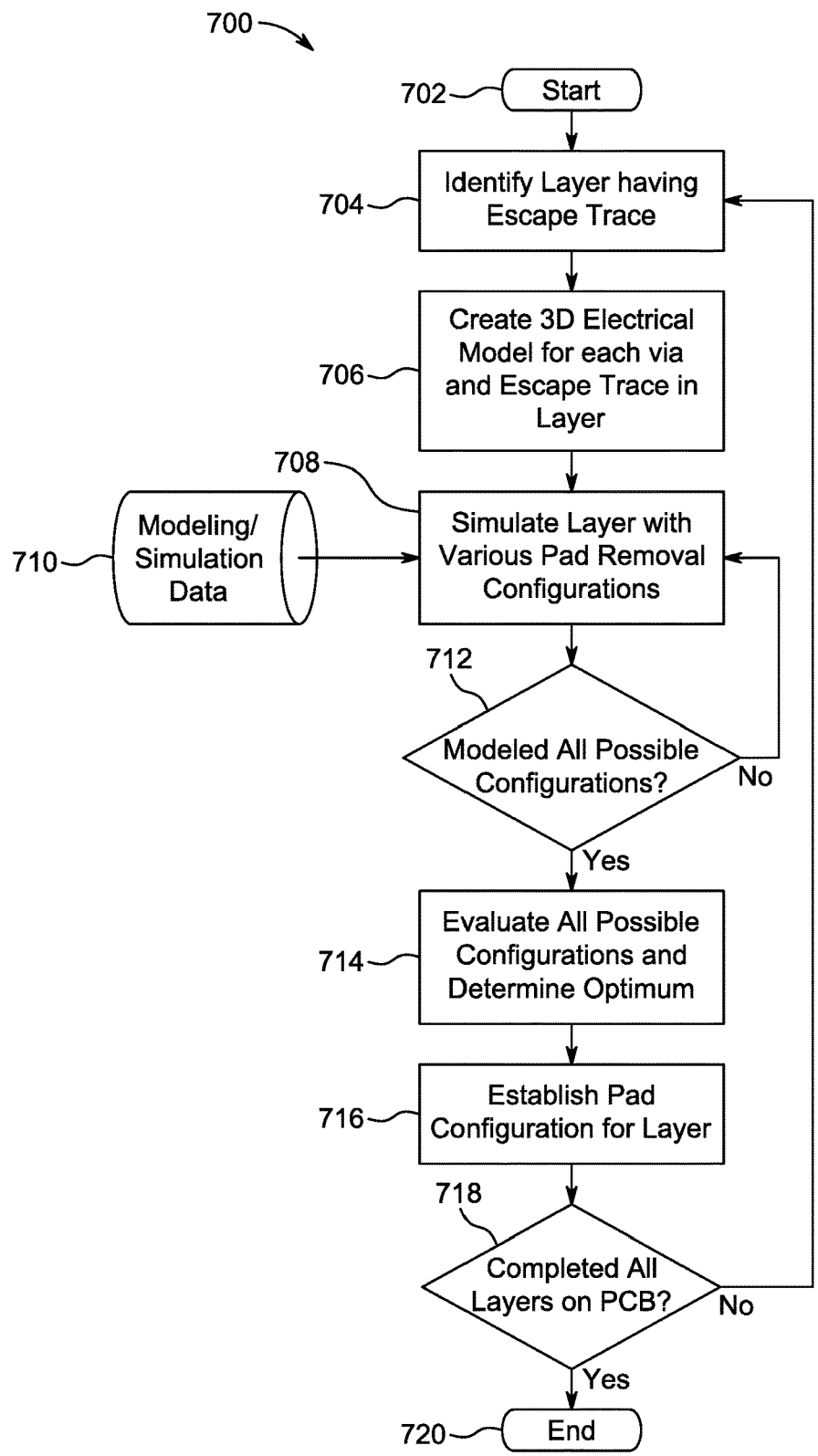
FIG. 7 is a flow chart illustrating the optimization process utilized.

Referring now more specifically to FIG. 7, one detailed embodiment of the process 700 used to accomplish impedance optimization is described. The optimization process is initiated at starting point 702 and first moves to step 704, where one of the layers having an escape trace is identified. Next, a 3D electrical model is created for each via and escape trace in the identified layer (see, step 706). Once the 3D models are created, further simulations are carried out with various pad removal configurations considered. As would be appreciated, modeling/simulation data 710 is used in this step. This process is repeated, until all possible configurations are modeled (shown by decision block 712, which determines if all configurations have been considered). At this point, all of the possible configurations are evaluated (step 714) to determine the optimum configuration, which is the established as the desired/optimized pad configuration for vias with escape traces on that layer. The process then moves on to repeat this process for multiple layers, until the entire circuit board has been optimized.

Once the above discussed process is completed, the board manufacturer will have information necessary to fabricate the vias of the subject circuit board. For each via on the board, the fabrication information includes a pad stack which provides the details necessary for board fabrication, including barrel diameter for the via, pad diameters for the pads which will be included, information related to anti-pads (clear areas or voids which must exist, such as those areas surrounding the vias on the ground plane or the power plane), and any details related to back drilling necessary. The pad stack can then be combined with additional information to create an overall fabrication plan for the circuit board itself. This level of detail is often provided in the form of a fabrication file, which can be used in automated fabrication processes.

It has been discovered that PCB design/construction using selective removal of non-functional via pads is an effective and valuable technique to facilitate high-speed designs. By using this technique, a specific high-speed design function is provided to these "non-functional" pads in a manner that has not been previously conceived or intended. This provides an unexpected ability to selectively tailor each via type, dependent on the via layer depth, top surface package type, and bottom layer escape layer geometry.

In a preferred embodiment, the design methodology employs EM 3D simulation to determine which pads to keep and which to remove, on a layer by layer basis. In test circumstances, this approach has been employed on a custom 32 Gbps electrical test PCB, to optimize the via and pad design for the critical and dense structures under the SerDes ASIC. The benefits have been quantified in both simulation and bench-top measurements, both with and without selective pad removal. In these exercises, the S-parameter results (transfer function "black box" response) has shown a noticeable improvement in return loss (i.e. reflection noise, adding to jitter). Test boards have provided dozens of lanes running at 32 Gbps below 1E-12 BER, across 5"-18" of PCB etch and 0.5-2.25 m of copper cable on the test PCB, with all the critical SerDes package footprints employing selective design removal, individualized for each layer escape.

In board design, the package, footprint and associated vias represent the most challenging part of the overall copper interconnect, due to the extreme density of vias and confined escape geometries. Improvements in this PCA region have real-world impact, increasing efficiency and reliability. Using this approach in all critical high-speed board designs helps to achieve the highest levels of signal integrity performance and preserve the maximum timing and voltage margins in the systems involved.

Various embodiments of the invention have been described above for purposes of illustrating the details thereof and to enable one of ordinary skill in the art to make and use the invention. The details and features of the disclosed embodiment[s] are not intended to be limiting, as many variations and modifications will be readily apparent to those of skill in the art. Accordingly, the scope of the present disclosure is intended to be interpreted broadly and to include all variations and modifications coming within the scope and spirit of the appended claims and their legal equivalents.

The invention claimed is:

1. A method for tuning impedance characteristics of a printed circuit board during the manufacture thereof, the method comprising:

receiving a board layout for the printed circuit board, wherein the printed circuit board is multi-layered and the board layout includes a plurality of plated vias and wherein the vias each have at least one non-functional pad on at least one of the layers;

modeling the electrical impedance for at least one plated via set forth in the board layout, and developing a model for the electrical impedance of a theoretically modified version of the at least one plated via, the theoretically modified via being substantially identical to the at least one via but also having the at least one non-functional pad removed;

comparing the modeled electrical impedance of the at least one via and the modeled impedance of the at least one theoretically modified via with an ideal impedance, and determining which provides a preferred electrical impedance;

modifying the board layout to include either the modeled at least one via or the theoretically modified version of the at least one plated via so as to achieve the preferred electrical impedance; and releasing the board modified board layout and producing the printed circuit board utilizing the modified board layout.

2. The method of claim 1 wherein the via has a plurality of non-functional pads, and further comprising:

developing a plurality of theoretical models for a collection of theoretically modified vias, wherein the collection of theoretically modified vias includes all possible combinations of removed and included non-functional pads, and determining an electrical impedance profile for each of the theoretical models;

comparing the electrical impedance profile of each of the theoretical models with the preferred impedance profile, and determining which theoretical model has an impedance profile most closely matching the preferred impedance profile; and wherein the step of modifying the board layout includes using the determined theoretical model for the included via configuration.

3. The method of claim 2 further comprising
developing manufacturing specifications which include detailed information for each via in the board; and
using the manufacturing specifications to manufacture the circuit board.

4. The method of claim 3 wherein the detailed information includes a pad stack for each of the vias, wherein the pad stack provides at least one of the bore details, the dimension of non-functional pads, the identification and location of anti-pads, and back-drill detail.

5. The method of claim 1 further comprising, for each via, developing a plurality of electrical models corresponding to a plurality of potential modifications for the via, wherein the plurality of modifications include all possible pad configurations for the via, modeling the electrical impedance for each of the plurality of potential modifications, and selecting a preferred potential modification which provides a most favorable impedance, such that the selected preferred potential modification can be used in the fabrication of the board.

6. The method of claim 5 wherein the preferred potential modification for each via is used to develop a pad stack for each via on the board, such that a fabrication packet can be developed which sets forth fabrication details for each via.

7. A method for fabricating a multi-layer printed circuit board having improved impedance characteristic, comprising
developing a board layout, wherein the board layout describes a plurality of signal traces to be placed on various layers of the multi-layer printed circuit board, a plurality of vias to allow communication of signals between the various layers, and a pad stack for each of the plurality of vias;
analyzing the pad stack for each of the plurality of vias to determine the effect on electrical impedance caused by a plurality of non-functional pads included in the pad stack, and thus developing a preferred via layout resulting in an optimum impedance for each via;
creating a revised board layout based upon the analysis of the pad stack, wherein the revised board layout includes the preferred via layout;
fabricating the multi-layer printed circuit board using the revised board layout, wherein the fabrication comprises elimination at least one non-functional pad based upon details set forth in the preferred via layout.

8. The method of claim 7 wherein the analysis of the pad stack for each of the plurality of vias comprises, for each of the plurality of vias, simulating at least one electrical circuit which includes the via.

9. The method of claim 8 wherein elimination of the at least one non-functional pad comprises removal of the pad after a coating process which forms the pad.

10. The method of claim 8 wherein the elimination of the at least one non-functional pad comprises adjusting a coating process so the pad is not crated on the layer involved.

11. The method of claim 7 wherein the pad stack includes a barrel diameter for the via, which layers of the multi-layer board include a pad and which layers include an anti-pad, and pad dimensions for each pad included as part of the via.

12. A multi-layered printed circuit board, comprising:
a circuit board structure having a plurality of dielectric material layers with signal carrying structures sandwiched therebetween, the dielectric material layers further including a top board layer configured to support a plurality of signal contacts and a plurality of signal transmission structures on the top surface thereof, wherein the signal contacts are configured to support and provide electrical connections to the plurality of electrical components, and to provide a plurality of signal transmission paths allowing communication of the electrical signals to predetermined locations on the top surface;
a plurality of vias extending from the top surface to at least one other layer of the multi-layered printed circuit board so as to provide electrical connection between the signal transmission structures on the top surface and the signal carrying structures sandwiched between the dielectric layers;
wherein the plurality of vias include a plurality of non-functional pads situated on selected layers, while a plurality of non-functional pads have been selectively omitted based upon a predetermined pad stack for each via;
wherein the predetermined pad stack has been developed by simulating the electrical impedance of the via and its related signal carrying structures to determine a preferred collection of non-functional pads to omit, which thus provides an optimum impedance for the via.

13. The multi-layer circuit board of claim 12 wherein the simulation of the electrical impedance includes simulating each possible combination of the via non-functional pads being included or removed.

14. The multi-layer circuit board of claim 13 wherein some of the signal carrying structures comprise a ground plane and a power plane, and where the pad stack specifies and anti-pad for those layers having either a ground plane or a power plane.

* * * * *